(12) United States Patent
Lane et al.

(10) Patent No.: US 6,777,629 B2
(45) Date of Patent: Aug. 17, 2004

(54) MICRO ELECTRO-MECHANICAL SYSTEM WITH ONE OR MORE MOVING PARTS METHOD AND APPARATUS

(75) Inventors: Spencer A. Lane, Irvine, CA (US); Krishna Jonnalagadda, Algonquin, IL (US); Manes Eliacin, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 143 days.

(21) Appl. No.: 10/156,780

(22) Filed: May 8, 2002

(65) Prior Publication Data

US 2003/0210116 A1 Nov. 13, 2003

(51) Int. Cl.$^7$ .............................. B81B 7/02; H01H 59/00
(52) U.S. Cl. ........................................ 200/181; 174/260
(58) Field of Search .................... 73/514.01–514.38; 310/42, 90.5, 309; 174/250–268; 200/181, 61.02; 333/101–108, 246, 262; 335/78

(56) References Cited

U.S. PATENT DOCUMENTS

| | | | |
|---|---|---|---|
| 4,943,750 A | * 7/1990 | Howe et al. | ................. 310/309 |
| 5,638,946 A | 6/1997 | Zavracky | |
| 6,069,540 A | 5/2000 | Berenz et al. | |
| 6,649,852 B2 | * 11/2003 | Chason et al. | .............. 200/181 |

* cited by examiner

*Primary Examiner*—James R Scott
(74) *Attorney, Agent, or Firm*—Daniel K. Nichols

(57) ABSTRACT

A meso-scale MEMS device having a movable member (51) is formed using standard printed wiring board and high density interconnect technologies and practices. In one embodiment, sacrificial material disposed about the movable member (51) is removed through openings (101, 102) as formed through a cover (91) to form a cavity (121) that retains and limits the freedom of movement of the movable member (51). The movable member can support a reflective surface (224) to thereby provide a mechanism that will support a projection display and/or image scanner (such as a bar code scanner).

26 Claims, 5 Drawing Sheets

US 6,777,629 B2

MICRO ELECTRO-MECHANICAL SYSTEM WITH ONE OR MORE MOVING PARTS METHOD AND APPARATUS

TECHNICAL FIELD

This invention relates generally to micro electromechanical system (MEMS) methods and apparatus.

BACKGROUND

MEMS devices and apparatus are known in the art. Much work (though few commercial breakthroughs) has been directed at small (a very few microns) systems that typically use semiconductor materials and processing techniques. It has also recently been proposed that printed wiring boards and corresponding fabrication techniques could be utilized to realize meso-scale MEMS structures (on the order of, for example, 25 to 300 microns). For example, U.S. application Ser. No. 09/929,750 as filed on Aug. 14, 2001 by the same assignee as this application describes a Micro Electro-Mechanical System that can be fabricated within the context of a printed wiring board using high density interconnect substrate technology.

Various useful structures to consider in this realm would require (or benefit from) one or more moving parts. For example, a mechanically-based electric switch needs one or more moving parts to facilitate the making and breaking of electrical contacts and associated electrical circuits. Proposals to date, however, for provision of moving parts while working at the meso-scale level with organic printed wiring board and high density interconnect substrate technologies are insufficient to meet many potential uses.

BRIEF DESCRIPTION OF THE DRAWINGS

This need and others are substantially met through provision of the micro electro-mechanical system with one or more moving parts method and apparatus as disclosed herein. This benefit and others will become clearer upon making a thorough review and study of the following description, and particularly when taken in conjunction with the drawings, wherein.

Figure 1:
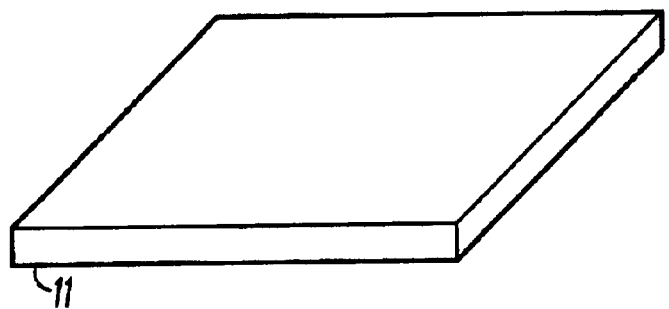
FIGS. 1–12 comprise a series of depictions illustrating a first embodiment as configured in accordance with the invention.

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention. Also, some common and well understood elements and aspects may not be shown to better facilitate an understanding of these embodiments.

DETAILED DESCRIPTION

Generally speaking, a meso-scale structure is formed on a printed wiring board wherein the meso-scale structure includes a movable member. Multiple sacrificial layers of material (such as polymer materials) are disposed overlying the printed wiring board with an intervening member (which may be comprised fully or partially of conductive material) disposed therein. A cover is disposed overlying these layers and portions of the sacrificial layers are then removed to thereby free the intervening member from integral association with the remaining meso-scale structure. Notwithstanding the non-integral relationship between the intervening member and the remainder of the meso-scale structure, the remaining elements of the meso-scale structure are sufficiently disposed about the intervening member such that the intervening member can move, but only within a substantially limited range of movement with respect to the printed wiring board and/or the meso-scale structure itself.

The resultant structure comprises a meso-scale MEMS apparatus comprising a printed wiring board, and a meso-scale structure disposed thereon having at least one meso-scale separate structure that is movably disposed proximal to but is also fully non-integral with respect to the meso-scale structure and that is substantially restrained to a predetermined range of movement with respect to the meso-scale structure. In various embodiments, multiple movable structures can be so provided. Conductive surfaces can be formed in proximity to the meso-scale separate structure to thereby provide, for example, switch contact surfaces that can be bridged by conductive material on the separate structure itself and/or electrode surfaces that can influence movement of the separate structure to effect desired control thereof.

If desired, the meso-scale separate structure can have a reflective surface and can be configured to be deflectable with respect to, for example, the printed wiring board. Such deflection can be about a pivot such that the reflective surface is laterally pivotable with respect to the pivot through substantially 360 degrees. Such deflection can also be accomplished in other ways, such as by restraining side portions of the reflective surface and causing middle portions to be urged into convex or concave configurations. Such a deflectable reflective surface can be used for a variety of purposes, including serving to facilitate a projection display and/or a scanning input device such as a bar code scanner.

These structures can be realized using relatively inexpensive and well understood printed wiring board fabrication and utilization techniques. Although larger than so-called micro-scale and nano-scale structures, the resultant meso-scale objects are nevertheless quite small and can greatly contribute to both reduced cost and reduced form factor requirements for devices that make use of such an approach.

Referring now to the drawings, and in particular to FIG. 1, a printed wiring board comprising a polymer carrier 11 can be provided through use of virtually any appropriate material, including FR-2 through FR-6, polyimide, CEM-1 through CEM-8, G-10 (an epoxy/woven glass material), modified epoxies, BT epoxy, cyanate ester, polytetrafluoroethylene (Teflon), and so forth. The polymer carrier 11 may have a conductive surface printed and etched thereon using conventional printed wiring board techniques to define and create various surfaces and objects as desired and appropriate to a given application. For purposes of this initial description, such features are not presented.

Figure 2:
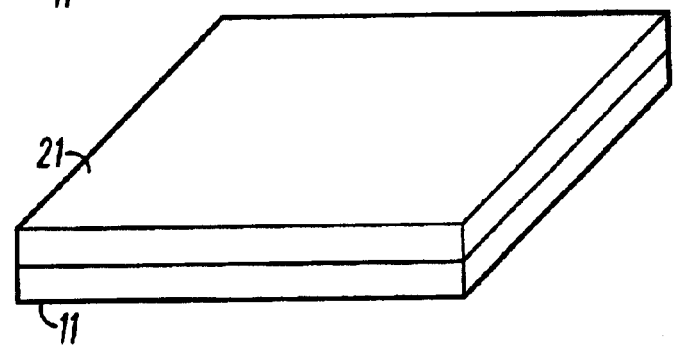
Figure 3:
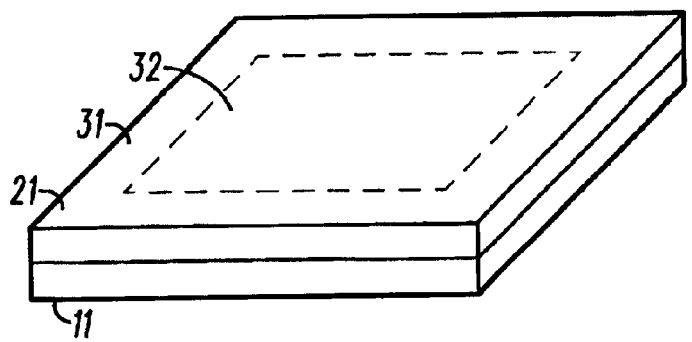

With reference to FIG. 2, a first sacrificial layer 21 (comprised, for example, of photoimageable resin such as a polymer like Probelec 81 or possibly photoimageable polyimide) is disposed over the carrier 11. A portion 31 (as shown in FIG. 3) of the first sacrificial layer 21 is exposed to ultraviolet light in accordance with well understood prior art technique to at least partially cure the material and thereby form what will become a cavity-defining boundary when un-exposed portions of the sacrificial layer 32 are later removed.

Figure 4:
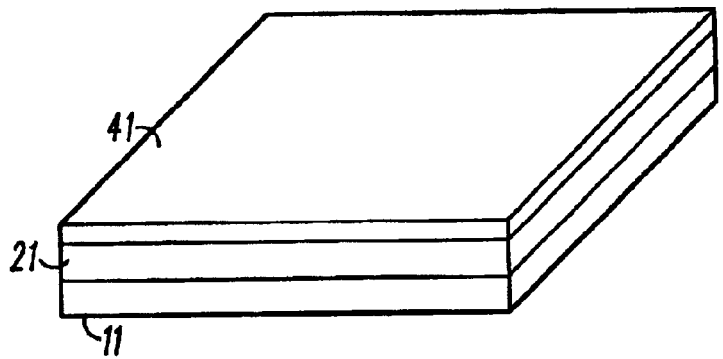
Figure 5:
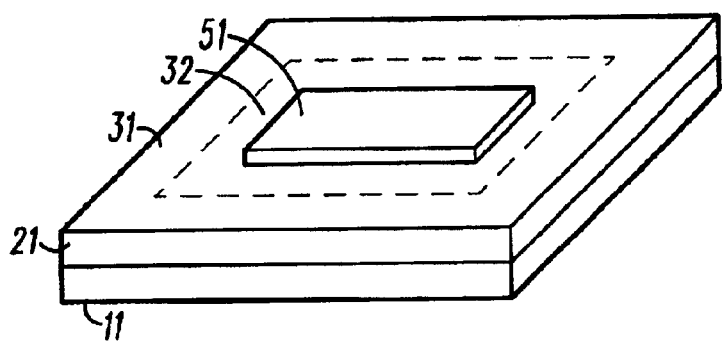

Referring now to FIG. 4, an intervening layer 41 is disposed over the first sacrificial layer 21. The intervening layer 41 can be comprised entirely of conductive material, such as copper, or can comprise a laminate of both insulating material (such as, again, a polymer material) and conductive material. (Also, if desired, this intervening layer can be comprised entirely of insulating material if that suits the particular application.) With reference to FIG. 5, portions of this intervening layer 41 are etched away (or otherwise removed in accordance with the type of material and corresponding material removal techniques) to leave, in this embodiment, an object that constitutes a meso-scale separate structure 51 ("separate" in that, once fabrication is complete, the structure 51 will not be integrally connected to the surrounding material). In this embodiment, the meso-scale separate structure 51 comprises a simple rectangle of conductive material. It should be noted that the meso-scale separate structure 51 overlies a portion of the first sacrificial layer 21 that was not exposed to ultraviolet light or otherwise cured. Therefore, at a later point during fabrication, it will be possible to remove this portion 32 of the first sacrificial layer 21 as presently supports the meso-scale separate structure 51.

Figure 6:
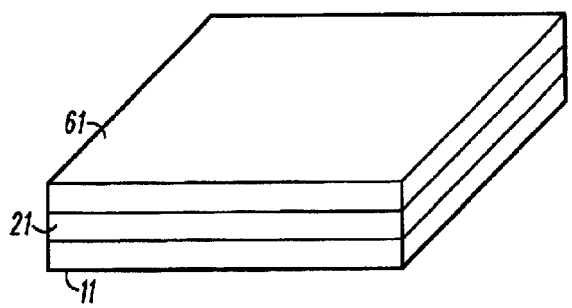
Figure 7:
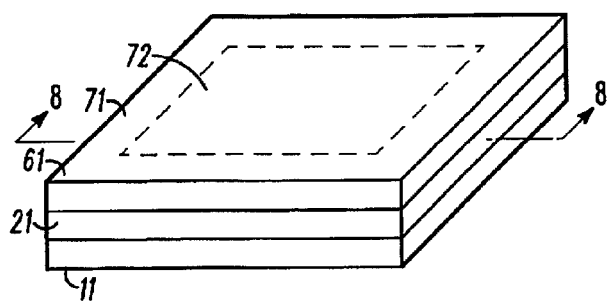
Figure 8:
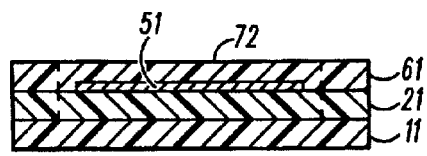

Referring now to FIG. 6, a second sacrificial layer 61 is disposed to overly the previously developed structure. This second sacrificial layer 61 can be comprised of the same material as is used to form the first sacrificial layer 21. And, again as with the first sacrificial layer 21, portions 71 of the second sacrificial layer 61 are exposed to ultraviolet light and/or otherwise at least partially cured while at least one other portion 72 is left unexposed/uncured. The latter portion 72, in this embodiment, overlies the intervening layer 51 as perhaps more clearly seen in cross-section in FIG. 8.

Figure 9:
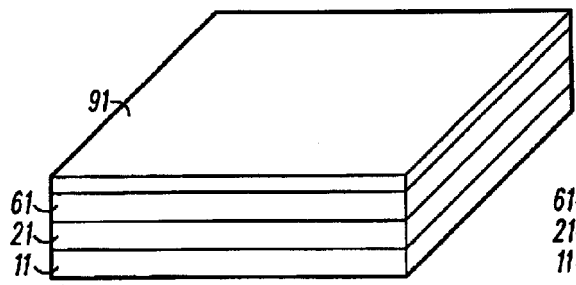
Figure 10:
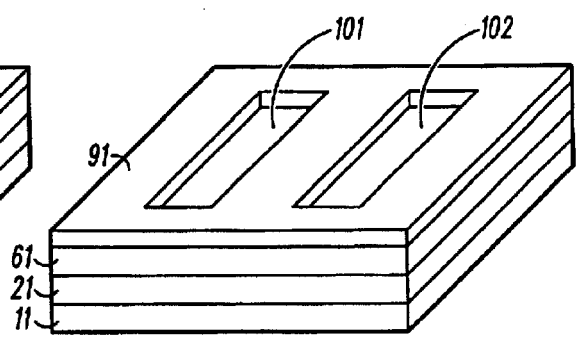

A cover 91 is then disposed over the second sacrificial layer 61 as shown in FIG. 9. This cover can be deposited, for example, using a deposition process or can be applied using a lamination technique. In this embodiment, the cover 91 is comprised of a conductive material such as copper, but can be formed of nonconductive materials too as appropriate to a given application. With reference to FIG. 10, in this embodiment, two openings 101 and 102 are then formed through the cover 91 through etching or other desired material removal process (in the alternative, and particularly when using a lamination fabrication approach, the openings 101 and 102 can be formed through the cover 91 prior to attaching the cover 91 to the remaining structure). Depending upon the application, the size of the overall structure, and various other parameters as may be important to a given configuration, fewer or more openings may be appropriate or necessary. Also as shown, the openings 101 and 102 are rectangular in shape. Again, depending upon the application, openings having a different shape may be appropriate or necessary.

Figure 11:
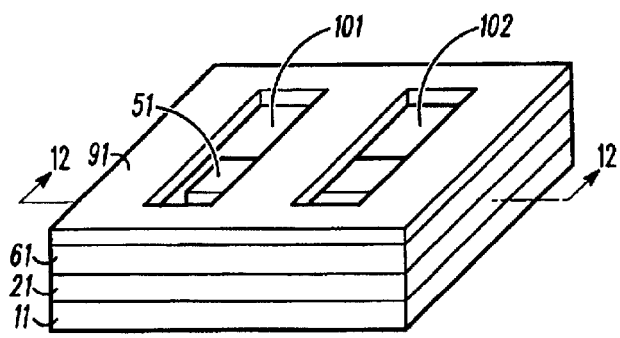
Figure 12:
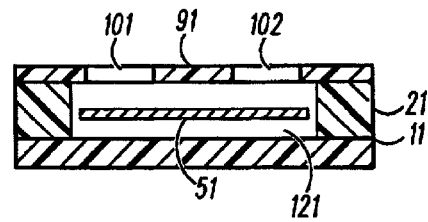

The overall structure is then heated in accordance with well understood prior art technique to polymerize the exposed portions of the first and second sacrificial layers 21 and 61. Using appropriate solvents as well understood in the art, unexposed sacrificial material from both the first and second sacrificial layers 21 and 61 is then removed through the openings 101 and 102 in the cover 91. By removing substantially all of the unexposed material below, above, and around the intervening layer 51, a cavity 121 as shown in FIGS. 11 and 12 is formed. This cavity 121 is bounded by the printed wiring board carrier 11, exposed portions of the first and second sacrificial layers 21 and 61, and the cover 91. The intervening layer 51 is free to move in all directions within the cavity 121 to the limits of these boundaries as the intervening layer 51 is otherwise non-integral to the surrounding materials (that is, the intervening layer 51 is not physically attached to and a part of any of the surrounding surfaces).

The above described process and resultant apparatus is illustrative and serves to describe general attributes of an embodiment configured in conformance with the invention. Conventional printing, etching, and striping steps can be used to define and form the above described constituent elements and components. Using such conventional means, meso-scale structures on the order of 25 to 300 microns can be readily formed that include a captured movable element.

Figure 13:
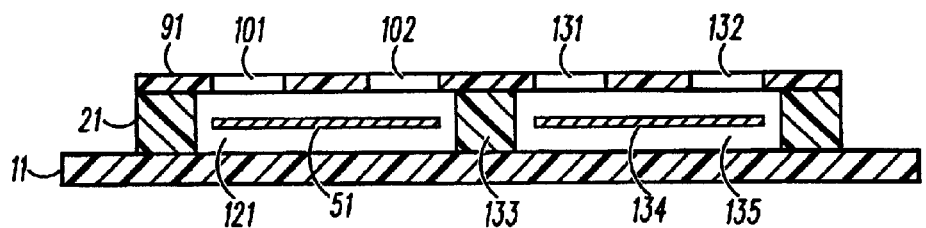
FIG. 13 comprises a depiction illustrating an alternative embodiment as configured in accordance with the invention.

These basic teachings can be used to support fabrication of a wide variety of alternative embodiments. As one illustration, and with reference to FIG. 13, the above steps can be modified to allow for formation of two cavities 121 and 135 wherein each of the cavities has an intervening layer 51 and 134 formed and disposed therein. These cavities 121 and 135 can be separated by a deposit 133 of exposed sacrificial material that will resist removal when flushing the sacrificial material through the openings 101, 102, 131, and 132 in the cover 91. If desired, of course, a cavity can be formed without an intervening layer being provided therein. Or, in the alternative, a cavity can be formed with a plurality of intervening layers being provided therein (such multiple intervening layers can be formed in the first instance in a shared plane and/or as stacked with respect to one another). And, of course, the various cavities and/or intervening layers can be formed in various sizes with respect to one another.

Figure 14:
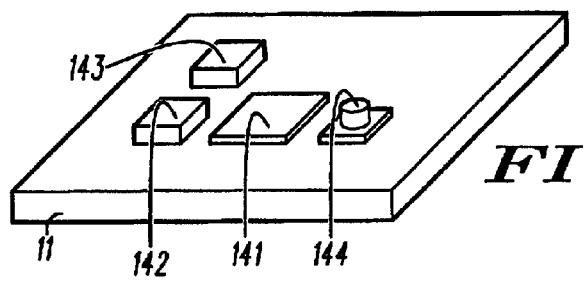
FIGS. 14–18 comprise a series of depictions illustrating another embodiment as configured in accordance with the invention.

As noted earlier, these techniques can be used to fabricate a variety of useful objects. As one example, a switch can be formed. With reference to FIG. 14, a printed wiring board carrier 11 can have conductive structures formed thereon (such structures can be formed using an initial layer of conductive material as may be laminated on the carrier 11 and/or by depositing conductive material on the carrier 11. In this embodiment, an electrode plate 141 is formed as a rectangular shaped conductor along with two switch contacts 142 and 143. In this embodiment, the two switch contacts 142 and 143 are thicker and extend further away from the carrier 11 than the electrode plate 141 (this can be achieved by depositing material on the switch contacts 142 and 143 and/or by abrading or otherwise removing material from the electrode plate 141). These relative thicknesses are provided in this embodiment so that the intervening layer will be able to bridge and close a conductive gap between the two switch contacts 142 and 143 while avoiding physical contact with the electrode plate 141. This embodiment also has a post 144 formed on the carrier 11. This post 144 can be formed entirely of conductive material or it can be comprised of nonconductive material having a conductor disposed at least partially thereabout. The purpose of the post 144 will become clearer below.

Figure 15:
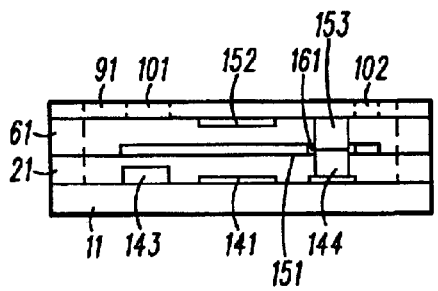
Figure 16:
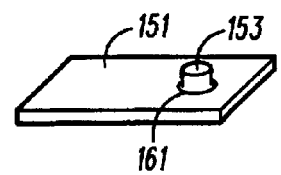

The remaining structure can then be fabricated largely as described above to develop a unified body as depicted in FIG. 15 (although shown as a sectional view, crosshatching has not been used to aid in preserving clarity). Differences include an intervening layer 151 having a hole 161 disposed therethrough (as perhaps best shown in FIG. 16) to accommodate a composite post formed of the post 144 formed initially on the printed wiring board carrier 11 as described above and an additional post 153. The additional post 153, along with another electrode surface 152, can be formed in a variety of ways. One approach would be to form them initially on the cover 91 and to then apply the cover 91 using a lamination process.

Figure 17:
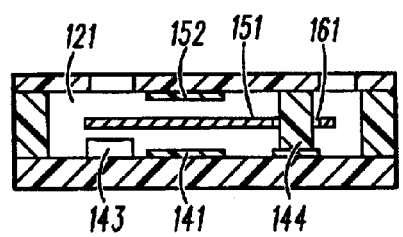
Figure 18:
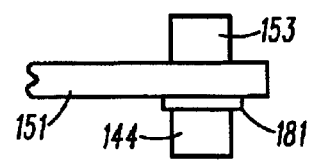

The sacrificial materials are then evacuated as above to yield a cavity 121 having the intervening layer 151 disposed therein as shown in FIG. 17. In this embodiment, the intervening layer 151 is again non-integral with respect to the remaining structure but is further limited with respect to lateral movement by the post. In general, the hole 161 through the intervening layer 151 will be of sufficient size such that the intervening layer 151 is capable of relatively free movement in the Z-plane with respect to the post 144/153. At the same time, it may be desirable to keep the hole 161 size relatively close to the size of the post 144/153 to usually likely ensure electrical continuity between these bodies (presuming, as in this embodiment, that the intervening layer 151 and post 144/153 are at least partially formed of conductive materials). In some embodiments it may be desirable to allow the intervening layer 151 full range of Z-plane movement. In this embodiment, however, and with reference to the detail illustrated in FIG. 18, a small annular lip 181 can be formed on the post 144 (and/or on post 153) of sufficient size such that the intervening layer 151 cannot readily move past the annular lip 181. This will tend to further restrict the range of movement of the intervening layer 151.

So configured, by applying a voltage to the lower electrode plate 141 and by coupling the conductive portions of the post 144/153 to ground, the conductive intervening layer 151 will be biased/urged towards the lower electrode plate 141. This movement will in turn cause the intervening layer 151 to contact both of the switch contacts 142 and 143 and thereby form a bridging conductive path therebetween. By removing the potential from the lower electrode plate 141 (and/or by applying voltage to the upper electrode plate 152), the intervening layer 151 will be removed from physical contact with the switch contacts 142 and 143 to thereby break the electrical connection therebetween.

Figure 19:
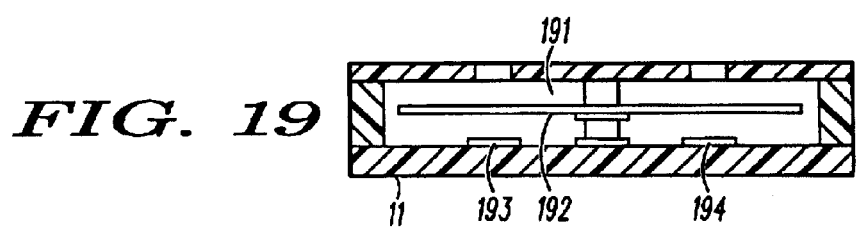
FIG. 19 comprises a depiction illustrating yet another alternative embodiment as configured in accordance with the invention.
Figure 20:
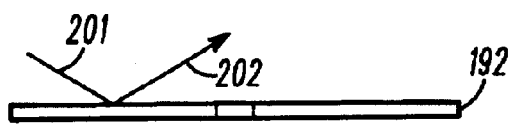
FIGS. 20 through 26 comprise various views of yet other embodiments as configured in accordance with the invention wherein a deflectable reflective surface is provided.
Figure 21:
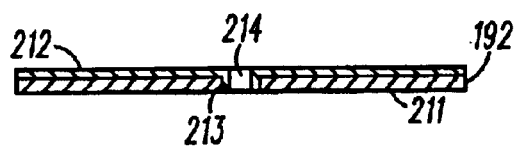

In this way a switch can be readily realized. Although capable of being fabricated using relatively simple, inexpensive printed wiring board fabrication and usage techniques and materials, a meso-scale switch (ranging, for example, from about 25 to 300 microns) can be realized. Various alterations can of course be made with respect to these basic teachings. As one example, and with reference to FIG. 19, the intervening layer 192 can extend within the cavity 191 on both sides of the post and can be controlled by electrode plates 193 and 194 as also disposed on opposing sides of the post. As another example, as described, only two sacrificial layers are deposited. If desired, each "layer" can itself be comprised of multiple such layers and/or additional layers can be added to those already described. These basic processes and elements can also be used to provide a selectively deflective reflective surface suitable for use with a small projection display and/or a scanning input device such as, for example, a bar code scanner. For example, and with reference to FIG. 20, the intervening layer 192 can be provided with a reflective surface such that light 201 will be at least substantially reflected 202 therefrom. Such a reflective surface can be realized in a variety of ways. For example, the entire intervening layer 192 can be comprised of a material such as copper, silver, or chrome (or, in the alternative, materials such as silver and chrome can be deposited on a smooth and polished copper intervening layer 192). If desired, and as depicted in FIG. 21, the intervening layer 192 can be comprised of a laminate comprising a polymer carrier 211 having an appropriate reflective material 212 (and such as copper, silver, or chrome) clad thereon. For purposes that will become more clear below, a via 214 can be formed through the intervening layer 192 (which via 214 can have conductive walls 213 formed therein that are in electrical contact with the conductive reflective surface). If desired and/or as appropriate to a given application, multiple vias of this sort can be provided. By providing such a reflective surface on the intervening layer 192, the reflective surface can be selectively moved by moving the intervening layer 192 as taught above to thereby cause light directed thereon to be reflected in various selected directions. So configured, the reflected light can be used to provide a projected display and or to direct a scanning beam for a scanner to a surface to be scanned as well understood in the art.

Figure 22:
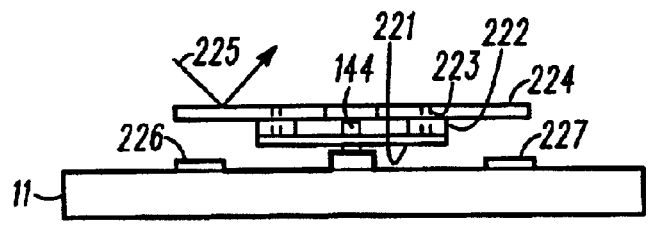
Figure 23:
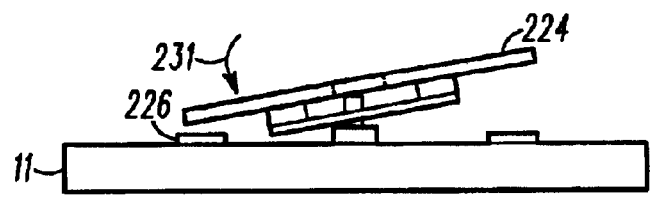

There are, of course, other ways that such a reflective surface can be realized through use of the basic techniques and material selections taught above. For example, with reference to FIG. 22, a reflective surface 224 can be formed as before, though in this embodiment the reflective surface 224 is disposed atop pedestals 222 that are themselves disposed atop a lower layer 221 to thereby form a multi-part integral intervening layer. These various layers and pedestals can be fully comprised of conductive materials. In the alternative, some or all may include polymer carriers. When non-conductive materials are used, however, conductive vias 223 are again provided to electrically couple conductive surfaces on the layer that bares the reflective surface 224 to conductive surfaces on the post 144 via a conductive path on the lower layer 221. So configured, the post 144 can be coupled to ground as before, and the reflective surface layer 224 will in turn be coupled to ground as well. So configured, light 225 can be directed to the reflective surface and reflected therefrom. At the same time, deflection of the reflective surface with respect to the printed wiring board 11 can be selectively controlled by appropriate energization of electrodes 226 and 227 as disposed on the printed wiring board 11. For example, as depicted in FIG. 23, by energizing one electrode 226, the reflective surface 224 can be urged 231 towards that electrode and thereby cause deflection of the reflective surface 224 with respect to the printed wiring board 11.

Figure 24:
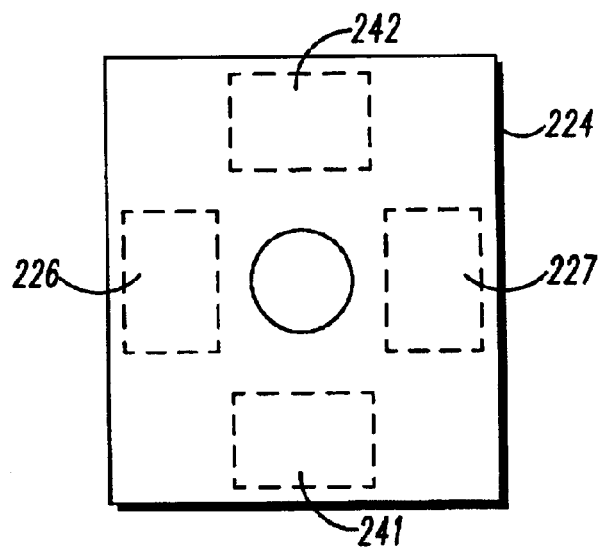

For some applications, it may be satisfactory to provide only limited deflection capability. For other applications, however, such as a projection display, something closer to 360 degrees of deflection capability with respect to the pivot 144 may be desirable. With reference to FIG. 24, by providing a greater number of electrodes, such as two more electrodes 241 and 242, four poles of attraction can be established that will allow selective lateral deflection of the reflective surface 224 over 360 degrees of potential movement.

Figure 25:
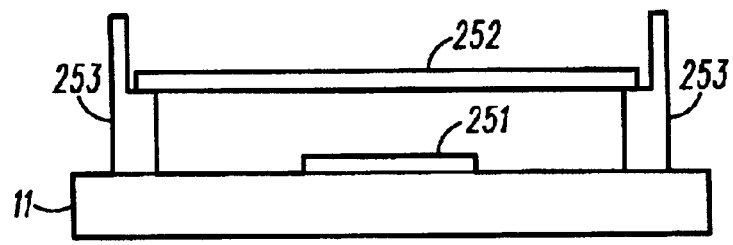
Figure 26:
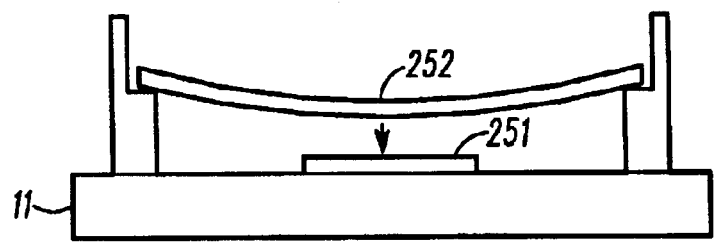

In the embodiments described above, the reflective surface remains planar and deflects with respect to the printed wiring board in a linear fashion. These teachings are applicable in other ways, however, to achieve the same results. For example, with reference to FIGS. 25 and 26, a reflective surface 252 can be formed that bridges two edge supports 253. So configured, and presuming that appropriate conductive paths are provided to allow the reflective surface 252 to be coupled to a desired voltage potential (such as ground), an electrode 251 as disposed on, for example, the printed wiring board 11 can be energized to cause the reflective surface 252 to flex downwardly towards the electrode. The amount of deflection can be controlled as a function of the applied voltage. By so controlling the concave/convex shape of the reflective surface 252, again the direction in which a light beam will be reflected can be selectively controlled and hence used for display projection and/or scanning purposes.

To achieve a meso-scale device of practical size, the amount of deflection reasonably achievable with such embodiments may be relatively small (2 degrees or so is readily achievable using standard printed wiring board techniques and staying within a meso-scale range of element dimensions). Even such a relatively small degree of deflection, however, can usefully serve to facilitate a projected display or image scanner due in part to the relatively greater distances the resultant light beams will likely travel before striking the projection or scanned surface.

Those skilled in the art will therefore recognize that various alterations, modifications, and combinations can be made with respect to the various embodiments described above. For example, numerous other devices other than the switch as described can be formed using these techniques. Also, multiple such devices can be formed on a shared printed wiring board, either alone or in combination with other printed wiring board circuits and structures. Such alterations, modifications, and combinations are not to be viewed as being outside the appropriate scope of the invention.

We claim:

1. A meso-scale MEMS apparatus comprising:
   a printed wiring board comprised at least in part of polymer material;
   a meso-scale structure disposed on the printed wiring board; and
   at least one meso-scale separate structure that is movably disposed proximal to and fully non-integrally with respect to the meso-scale structure and that is substantially restrained to no more than a predetermined range of movement with respect to the meso-scale structure.

2. The meso-scale MEMS apparatus of claim 1 wherein the meso-scale structure comprises an electric switch.

3. The meso-scale MEMS apparatus of claim 2 wherein the at least one meso-scale separate structure includes at least one conductive surface.

4. The meso-scale MEMS apparatus of claim 1 wherein the at least one meso-scale separate structure is comprised of conductive material.

5. The meso-scale MEMS apparatus of claim 4 wherein the conductive material comprises copper.

6. The meso-scale MEMS apparatus of claim 1 wherein the meso-scale structure has a largest dimension that is no greater than about 300 mils.

7. The meso-scale MEMS apparatus of claim 1 wherein the at least one meso-scale separate structure has at least one hole disposed therethrough.

8. The meso-scale MEMS apparatus of claim 7 wherein the meso-scale structure includes a post disposed through the meso-scale separate structure hole.

9. The meso-scale MEMS apparatus of claim 8 wherein the post is at least partially comprised of conductive material.

10. The meso-scale MEMS apparatus of claim 1 wherein the meso-scale structure includes at least one conductive surface disposed to at least occasionally be contacted by the at least one meso-scale separate structure.

11. The meso-scale MEMS apparatus of claim 10 wherein the meso-scale structure includes at least two conductive surfaces disposed to at least occasionally be both contacted simultaneously by the at least one meso-scale separate structure, wherein the at least two conductive surfaces and the at least one meso-scale separate structure comprises an electric circuit.

12. The meso-scale MEMS apparatus of claim 1 and further comprising at least a second meso-scale separate structure that is movably disposed proximal to and fully non-integrally with respect to the meso-scale structure and that is substantially restrained to no more than a predetermined range of movement with respect to the meso-scale structure.

13. The meso-scale MEMS apparatus of claim 1 wherein the at least one meso-scale separate structure comprises an electrical ground.

14. The meso-scale MEMS apparatus of claim 13 wherein the meso-scale structure includes at least one electrode disposed proximal to the at least one meso-scale separate structure.

15. The meso-scale MEMS apparatus of claim 14 wherein the meso-scale structure includes at least one conductive contact that is disposed to contact the at least one meso-scale separate structure when the at least one meso-scale separate structure is biased towards the at least one electrode.

16. The meso-scale MEMS apparatus of claim 13 wherein the meso-scale structure includes:
   at least a first and second electrode disposed proximal to and on opposite sides of the at least one meso-scale structure; and
   at least a first and second electrode disposed proximal to the at least one meso-scale structure;
   such that the first electrode is disposed to contact the at least one meso-scale separate structure when the at least one meso-scale separate structure is biased towards the first electrode and the second electrode is disposed to contact the at least one meso-scale separate structure when the at least one meso-scale separate structure is biased towards the second electrode.

17. The meso-scale MEMS apparatus of claim 1 wherein the at least one meso-scale separate structure is disposed within a cavity that is formed in the meso-scale structure.

18. The meso-scale MEMS apparatus of claim 1 wherein the at least one meso-scale separate structure has a substantially reflective surface.

19. The meso-scale MEMS apparatus of claim 18 wherein the substantially reflective surface includes at least one of copper, silver, and chrome.

20. The meso-scale MEMS apparatus of claim 18 wherein the reflective surface is deflectable with respect to the printed wiring board.

21. The meso-scale MEMS apparatus of claim 20 wherein the reflective surface is pivotable about a pivot, which pivot is substantially fixed with respect to the printed wiring board.

22. The meso-scale MEMS apparatus of claim 21 wherein the reflective surface is laterally pivotable with respect to the pivot through substantially 360 degrees.

23. The meso-scale MEMS apparatus of claim 20 wherein the reflective surface is deflectable by assuming at least one of a concave and a convex shape.

24. The meso-scale MEMS apparatus of claim 20 wherein the meso-scale structure includes at least one electrode.

25. The meso-scale MEMS apparatus of claim 24 wherein the at least one electrode selectively acts upon the reflective surface to thereby selectively deflect the reflective surface with respect to the printed wiring board.

26. The meso-scale MEMS apparatus of claim 25 and further including a plurality of electrodes, wherein at least a plurality of the plurality of electrodes selectively act upon the reflective surface to thereby selectively deflect the reflective surface with respect to the printed wiring board.

* * * * *